US008551822B2

United States Patent
Tung

(10) Patent No.: US 8,551,822 B2
(45) Date of Patent: Oct. 8, 2013

(54) METHOD FOR MANUFACTURING ARRAY SUBSTRATE

(75) Inventor: Chun-Hao Tung, Hsin-Chu (TW)

(73) Assignee: Quanta Display Inc., Tao Yuan Shien (TW)

( * ) Notice: Subject to any disclaimer, the term of this patent is extended or adjusted under 35 U.S.C. 154(b) by 675 days.

(21) Appl. No.: 12/005,289

(22) Filed: Dec. 27, 2007

(65) Prior Publication Data

US 2008/0213949 A1 Sep. 4, 2008

(30) Foreign Application Priority Data

Jan. 2, 2007 (TW) .............................. 96100044 A

(51) Int. Cl.
*H01L 21/00* (2006.01)
(52) U.S. Cl.
USPC ............ 438/149; 257/E29.151; 257/E29.137; 257/E29.202
(58) Field of Classification Search
USPC ....................................................... 438/149
See application file for complete search history.

(56) References Cited

U.S. PATENT DOCUMENTS

| | | |
|---|---|---|
| 7,785,940 B2 * | 8/2010 | Kwack ........................... 438/151 |
| 2005/0185126 A1 * | 8/2005 | Kawasaki ...................... 349/148 |
| 2007/0042537 A1 * | 2/2007 | Lee ................................ 438/158 |

FOREIGN PATENT DOCUMENTS

| | | |
|---|---|---|
| CN | 1237373 C | 7/2004 |
| JP | 2005108912 | 4/2005 |
| JP | 2007189120 | 7/2007 |
| JP | 2008010440 | 1/2008 |

* cited by examiner

*Primary Examiner* — Julio J Maldonado
*Assistant Examiner* — Mohammad Choudhry
(74) *Attorney, Agent, or Firm* — Bacon & Thomas, PLLC

(57) ABSTRACT

A method for manufacturing a substrate for a flat panel display device is disclosed. The present method uses photolithography with four masks to manufacture a TFT-LCD. After the third half-tone mask is used, the manufacturing of the TFTs and the defining of the pixel area of the substrate can be completed. The present method can avoid the alignment deviation and the generation of parasitic capacitance happened on the substrate made through the conventional photolithography with five masks. Therefore, the present method can reduce the costs and increase the yield. Moreover, the substrate for the TFT-LCD made by the present method can define a channel region in the semiconductor layer after the second half-tone mask. Hence, the subsequent manufacturing for forming a transparent conductive layer, a source, and a drain can be achieved by wet etching to effectively reduce the non-homogeneous etching for the channel region in the semiconductor layer.

14 Claims, 5 Drawing Sheets

METHOD FOR MANUFACTURING ARRAY SUBSTRATE

BACKGROUND OF THE INVENTION

1. Field of the Invention

The present invention relates to a method for manufacturing a substrate applied in a flat panel display device, and more particularly, to a method for manufacturing a substrate for use in a thin film transistor liquid crystal display (TFT-LCD).

2. Description of Related Art

In comparison with conventional cathode ray tubes (CRTs), LCDs have advantages of low power consumption, being slim-line, and being free of radiation; however, TFT-LCDs are expensive. Especially, during photolithography for manufacturing the TFT arrays of LCDs, the quantity of masks can not effectually be decreased and this causes the final cost of the screen to be high.

In conventional technologies, six-mask or five-mask photolithography is performed to manufacture a TFT array substrate. The processes are approximately as follows. The first mask process is used for defining the first metal layer to form the components of scan lines, and the gate of TFTs etc. The second mask process is applied to define channel regions of TFTs and an ohmic contact layer. The third mask process is performed to define the second metal layer to form the components of data lines and the source/drain of TFTs etc. The fourth mask process is applied to pattern the protection layer. The fifth mask process is executed to pattern the transparent conductive layer forming pixel electrodes.

Because the conventional processes of manufacturing TFTs are time-consuming and complex, the costs are high and deficiencies, such as misalignment, production of external parasitic capacitance, and uneven etching of the channel regions etc. may easily occur. As the development in TFT-LCDs leads to products having especially large screens, the processes for manufacturing TFT substrates will face many problems, such as decrease of both the yield and the efficiency of production. Therefore, how to reduce the quantity of masks for manufacturing a TFT array substrate so as to simplify the processes thereof has become an important goal. Hence, there is a requirement for a method of manufacturing LCD substrates. The method is required to simplify the processes of photolithography to reduce the difficulty of the manufacture, besides overcoming the deficiencies, such as misalignment, production of external parasitic capacitance, and uneven etching of the channel regions etc. in the conventional processes so as to promote the yield and the efficiency of production.

SUMMARY OF THE INVENTION

The present invention relates to a method for manufacturing an array substrate. The TFT-LCD substrate is manufactured through four mask processes. Specifically, various patterns having different thicknesses in the photoresist can be formed at the same time through the third photolithography in the present invention. Therefore, the manufacture of the TFTs is completed, and the pixel areas of the substrate are defined by fewer processes in the present invention that by those in the conventional methods. Thus, the goal of decreasing the quantity of masks can be achieved.

Therefore, the method of the present invention for manufacturing the array substrate can be used to avoid problems of alignment deviation and parasitic capacitance produced from conventional five-mask processes. Furthermore, the costs can be retrenched and the efficiency of the production can be advanced.

The present invention provides a method for manufacturing an array substrate, comprising the following steps: (a) providing a substrate; (b) forming a patterned first metal layer on the surface of the substrate; (c) forming a first insulation layer and a semiconductor layer in sequence to cover the substrate and the first metal layer, and patterning the semiconductor layer by photolithography to form plural transistor switch areas; (d) forming a transparent conductive layer and a second metal layer in sequence over the substrate; (e) forming a photoresist on the surface of the second metal layer, and performing exposure and development to make the photoresist have at least two thicknesses; and (f) etching the second metal layer uncovered by the photoresist, the transparent conductive layer uncovered by the photoresist, and the photoresist to form a source and a drain in every transistor switch area. The transistor switch areas of the present invention comprise the second metal layer, and the source and the drain are not conducted to each other.

In order to protect TFTs formed on the surface from environmental oxidation or effects in the subsequent processes, the method for manufacturing the LCD substrate in the present embodiment can further comprise a step (g): forming a patterned second insulation layer on the surfaces of the transistor switch areas and the first insulation layer.

In the method for manufacturing the array substrate of the present invention, the TFTs can be formed on the surface. Besides, if required for the processes, terminal regions, capacitance areas, scan lines, data lines, and pixel areas can also be formed on the surface of the substrate so as to provide a complete substrate applicable for a TFT-LCD.

Preferably, besides forming the second insulation layer to protect the TFTs in step (g) of the method in the present invention, a terminal region can selectively be defined on the surface of the substrate. In one preferred embodiment of the present invention, step (g) can further comprise: forming a second insulation layer on the surfaces of the first insulation layer and the transistor switch areas; and patterning the second insulation layer and the first insulation layer by the photolithography to reveal part of the first metal layer. The revealed part of the first metal layer can be used as a terminal region of the substrate.

The patterned first metal layer formed in step (b) of the present invention can comprise a gate and plural scan lines that are used in every transistor switch area. Preferably, besides forming the transistor switch areas in step (c) of the method in the present invention, plural capacitance areas and plural conductive-line areas can selectively be defined, in which the capacitance areas, the conductive-line areas, and the transistor switch areas do not overlap each other respectively. The conductive-line areas described in the present invention can preferably serve as data-line areas.

The transparent conductive layer revealed after the etching of step (f) in the present invention can be disposed out of the transistor switch areas, or out of the second metal layer of the transistor switch areas. Furthermore, the revealed part of the transparent conductive layer can serve as a pixel area on the surface of the substrate. In the third photolithography step of the present invention, the TFTs and the pixel areas on the surface of the substrate can be manufactured and defined, respectively.

Besides, the channel regions of the semiconductor layer in the TFTs can be manufactured in any sequence, but preferably are formed by etching in step (c) or by etching in step (f), and more preferably are formed by etching in step (c). In the present invention, the etching in step (c) can be in the second photolithography, and that in step (f) can be in the third photolithography. Masks used in the above-mentioned processes can be half-tone masks, multi-tone masks, or gray-tone masks for exposure and development, but preferably are half-tone masks.

The thickness of the channel regions of the semiconductor layer in the TFTs after etching are not limited to, but preferably are 600 to 1500 Å, and more preferably are 1000 to 1200 Å. The transmittance for UV light in the half-tone masks of the present invention can be 25 to 65%, but preferably are 40 to 50%.

In the present invention, the half-tone masks can selectively be used in the second photolithography step to define the channel regions of the semiconductor layer in the TFTs. Therefore, the transparent electrode, the source, and the drain can subsequently be manufactured by wet etching. Problems such as uneven etching of the channel regions of the semiconductor layer can be efficiently solved, and the deficiencies, such as mura, in the substrate can be prevented.

In one preferred embodiment of the present invention, the semiconductor layer in every transistor switch area is etched by photolithography to form a channel region therein in step (c) for forming the transistor switch areas. In another preferred embodiment of the present invention, when etching the photoresist, the second metal layer, and the transparent conductive layer in step (f), the semiconductor layer in every transistor switch area is also etched to form a channel region therein.

Moreover, the structure of the TFTs manufactured in the method of the present invention is not limited to, but preferably is a structure having the source and the drain not conducting to each other. In one preferred embodiment, the source and the drain in the TFTs manufactured in the present invention can respectively have the second metal layer. In one preferred embodiment, the source in the TFTs manufactured in the present invention can have the second metal layer, and the transparent conductive is used as the drain.

In the method of the present invention, etching used in any step can be dry etching or wet etching. In step (f), etching can preferably be wet etching in order to advance etching selectivity of the semiconductor layer in the TFTs to reduce uneven etching for the channel region of the semiconductor layer.

The transistor switch areas formed in step (c) of the present invention can comprise the first metal layer serving as the gate of the transistor switch areas. After formation of the semiconductor layer in step (c), an ohmic contact layer can be formed on the surface of the semiconductor layer so that good ohmic contact between the semiconductor layer and the components in the upper layer of the TFTs is formed. Therefore, the electrical quality in the TFTs can be promoted. The ohmic contact layer can be made of any material, such as a conventional ohmic contact layer applied in the TFTs, but preferably is made of $N^+$ amorphous silicon.

The semiconductor layer, the insulation layers, the first metal layer, or the second metal layer can be formed by any conventional process, but preferably is formed by physical vapor deposition, such as ionized metal plasma physical vapor deposition (IMP-PVD); chemical vapor deposition, such as plasma enhanced chemical vapor deposition and thermal chemical vapor deposition; evaporation, such as metal evaporation; sputtering, such as long throw sputtering and collimated sputtering; or plating, such as electro-less plating and electroplating in wet processes.

Moreover, in the method for manufacturing an array substrate of the present invention, the flat display substrate is not limited to, but preferably is a silicon substrate, a glass substrate, or a plastic substrate. More preferably, the flat display substrate, such as but not limited to undoped silicon glass, phosphorus-doped glass, boron-phosphorus-doped glass, sodium calcium glass, boron silicate glass, sodium boron silicate glass, alkali metal boron silicate glass, aluminum silicate glass, aluminum boron silicate glass, alkaline-earth metal aluminum boron silicate glass, or combination thereof, can be applied in a substrate of an active-matrix driving flat display device.

In the TFTs manufactured in the present invention, the first insulation layer and the second metal layer can be made of any insulating materials, but preferably are organic materials, inorganic materials, or a combination thereof. More preferably, the first insulation layer and the second metal layer can be made of silicon oxide, silicon nitride, silicon hydroxide, or a combination thereof. The second insulation layer mentioned in the present invention can be a protection layer, a flat layer, or a combination thereof forming a multi-layers structure.

Besides, the semiconductor layer of the present invention can be made of any material, but preferably is amorphous silicon, or polymorphous silicon.

The transparent conductive layer of the present invention can be made of any transparent and conductive material, but preferably is indium tin oxide (ITO), indium zinc oxide (IZO), or indium tin zinc oxide (ITZO).

The material of the transparent conductive layer in the present invention can be selected according to the material of the second metal layer so that the great chemical potential difference between the transparent conductive layer and the second metal layer can be avoided to prevent the chemical reaction therebetween.

In the TFTs manufactured in the present invention, the first metal layer can be made of any material, but preferably is Al alloy, Cr alloy, Mo allay, or alloy thereof in order to serve as the gate of the TFTs. The second metal layer can be made of any material, but preferably is Al, W, Cr, Cu, Ti, $TiO_x$, Mo, or alloy thereof to be the source and the drain of the TFTs. The first metal layer and the second metal layer can be a structure of signal layer or multi-layers.

The present invention can provide a method for manufacturing an array substrate. Through four-mask photolithography, panels with TFTs are manufactured, and the time and the costs of the above-mentioned manufacture are decreased relative to the prior art.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 1A:
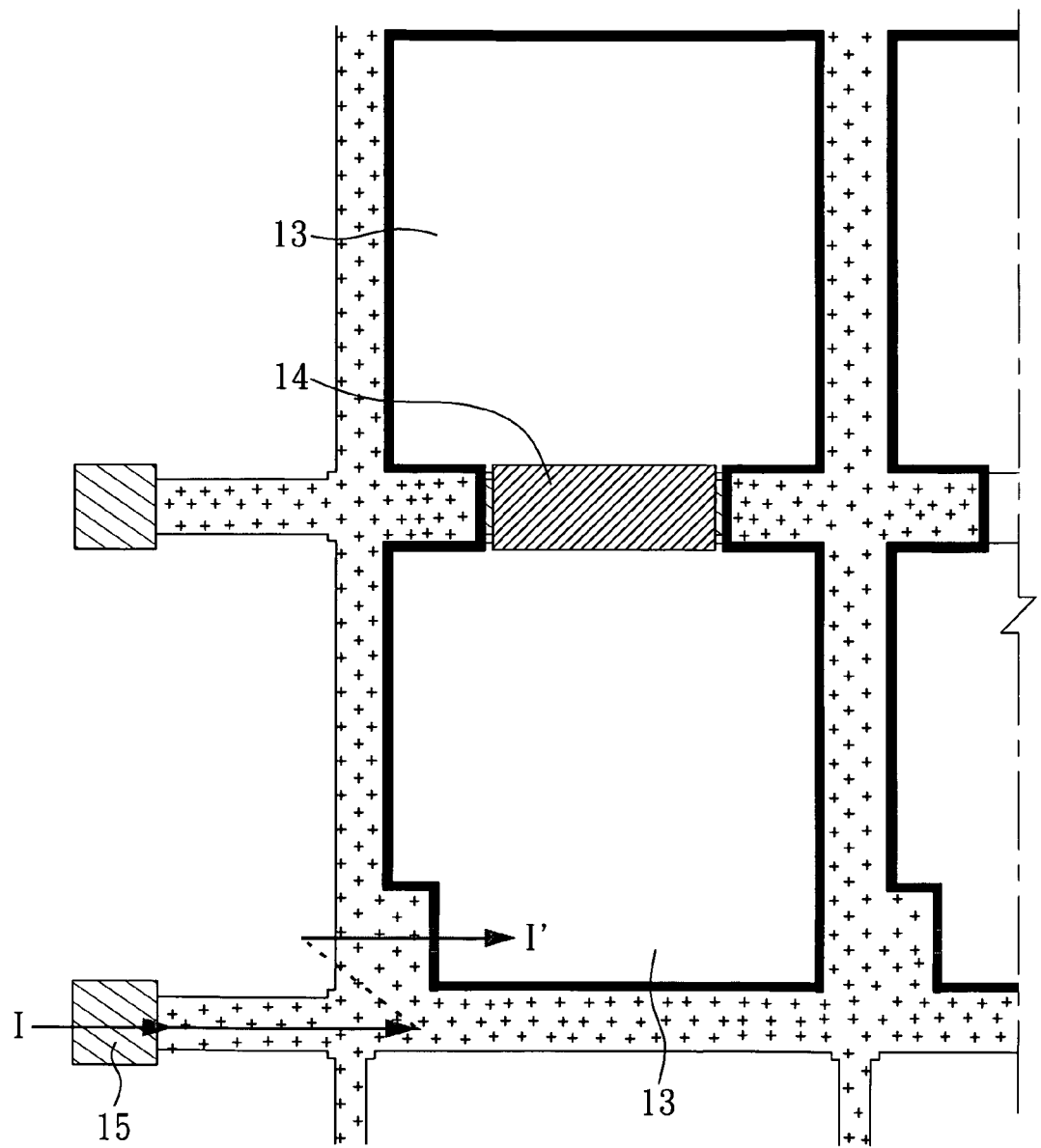
FIG. 1A is a top view of an LCD substrate in one preferred embodiment of the present invention.
Figure 1B:
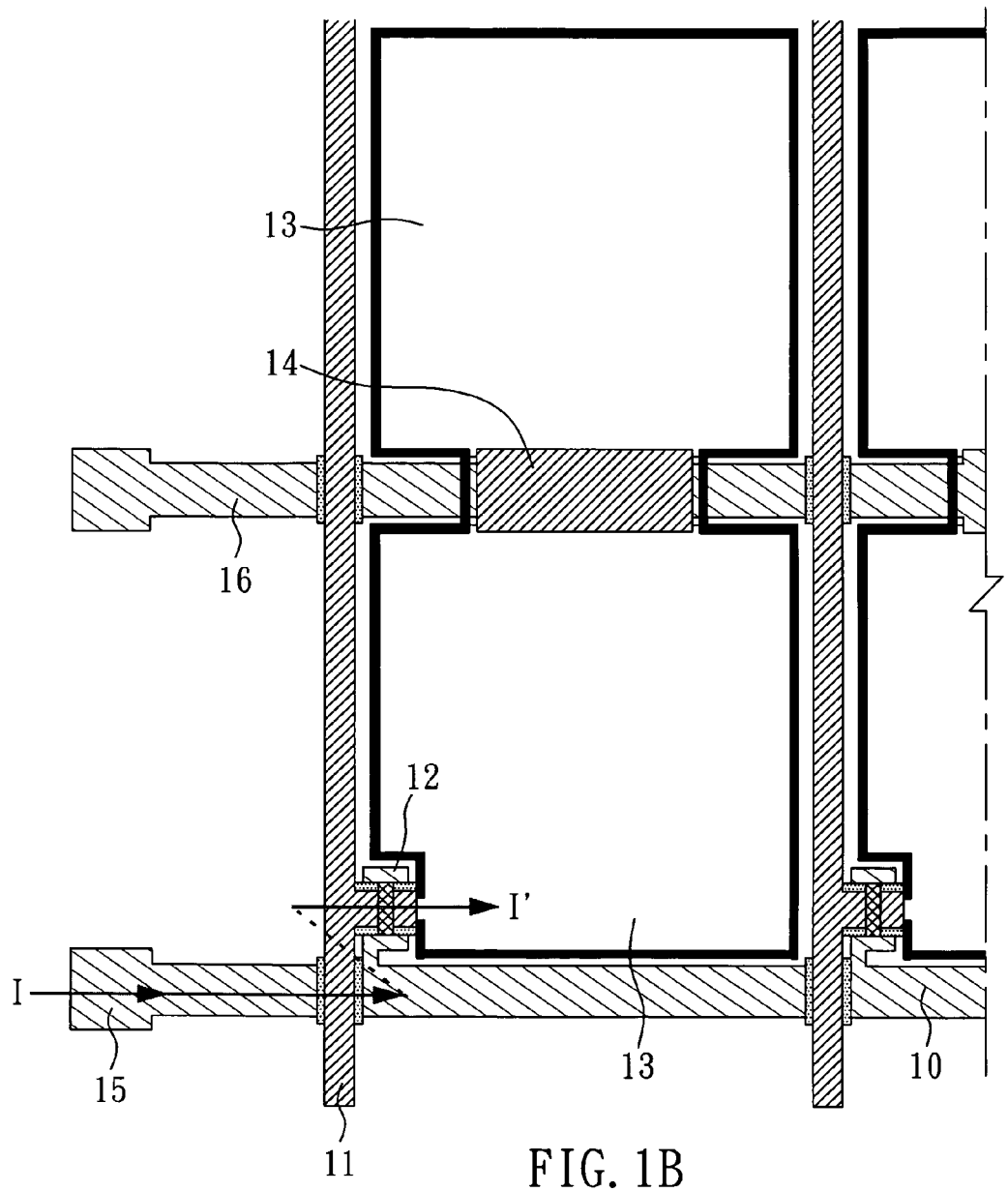
FIG. 1B is a perspective view of components of an LCD substrate in one preferred embodiment of the present invention.

See FIGS. 1A and 1B. FIG. 1A is a top view of an LCD substrate in one preferred embodiment of the present invention. An LCD substrate manufactured through the present invention includes pixel areas 13, capacitance areas 14, and terminal regions 15. Except for the above components, others are covered with an insulation layer. In convenience for explanation, as shown in FIG. 1B, other components comprise scan-line areas 10, data-line areas 11, transistor switch areas 12, and common-line areas 16. FIGS. 2(a) to 2(e) show a flow chart for manufacturing the LCD substrate of the present embodiment.

In the present embodiment, sectional views of FIGS. 2(a) to 2(e) are taken along the I-I' line shown in FIG. 1A.

Figure 2:
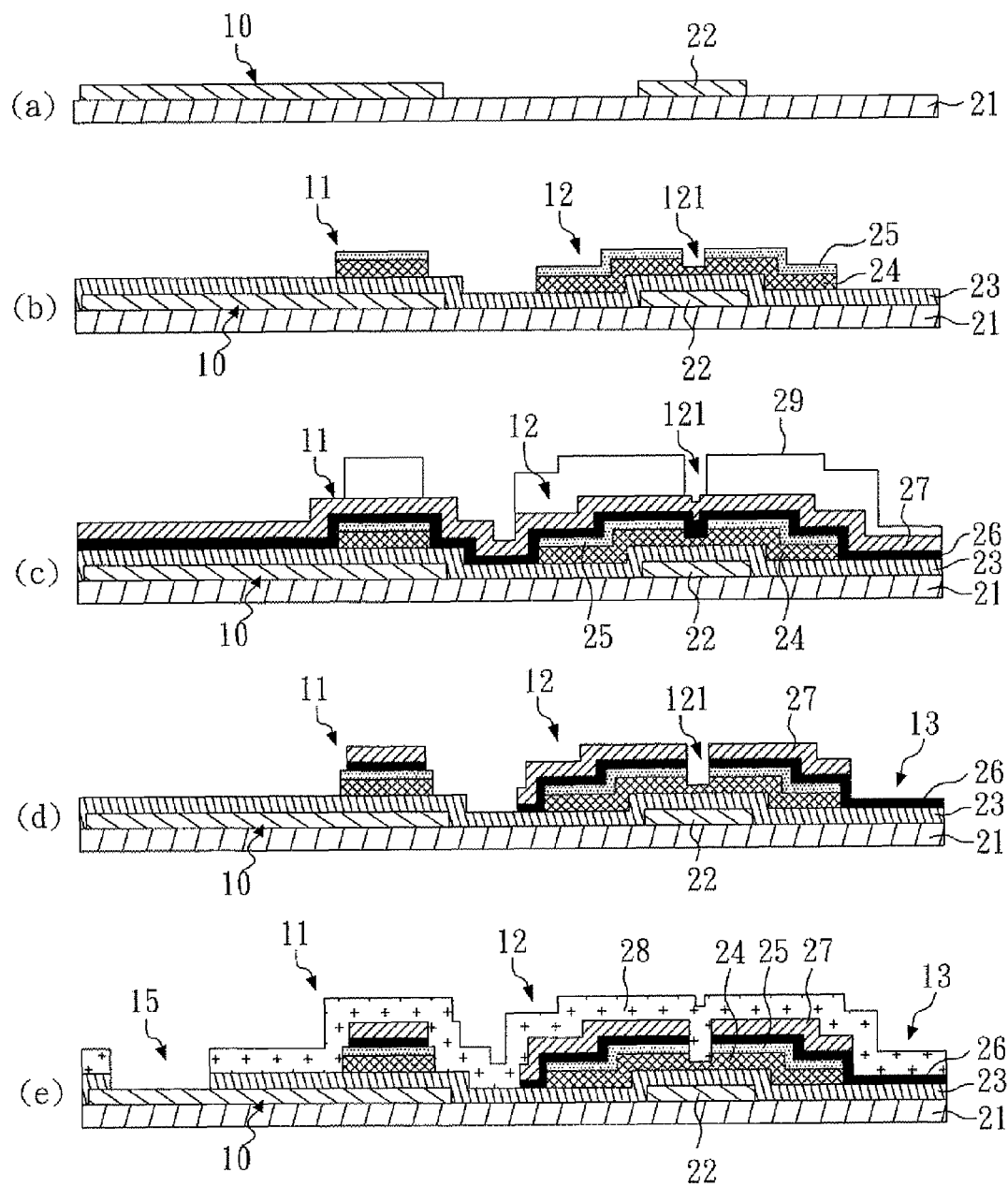
FIGS. 2(a) to 2(e) show a flow chart for manufacturing an LCD substrate in one preferred embodiment of the present invention, in which sectional views of these figures are taken along the I-I' line shown in FIG. 1A.

As shown in FIG. 2A, a transparent glass substrate 21 is first provided. A first metal layer 22 is formed on the surface of the substrate 21, and is processed by a first photolithography step to form a gate layer pattern. The first metal layer 22 is defined as scan lines 10 and a gate used for the transistor switch area 12. Besides, materials of the first metal layer are not limited to, but are preferably Al, W, Cr, Cu, Ti, $TiN_x$, Mo, or an alloy thereof. Structures of the first metal layer are not limited to a signal-layer structure, and also can be a multilayer structure (figures not shown). In the present embodiment, the first metal layer 22 is a single layer structure of Mo.

Subsequently, in FIG. 2(b), a first insulation layer 23, a semiconductor layer 24, and an ohmic contact layer 25 are deposited in sequence on the surfaces of the first metal layer 25 and the substrate 21. Data-line areas 11, transistor switch areas 12, and auxiliary capacitance areas 14 (not shown in FIG. 2(b)) are defined on the surface of the substrate 21 by a second photolithography step.

In the second photolithography step of the present embodiment, a half-tone mask is used for exposure and development. Therefore, a channel region 121 of the semiconductor layer 24 is defined in every transistor switch area 12 through formation of the transistor switch areas. Because the channel regions 121 of TFTs are formed in the second photolithography step, the subsequent formation for a transparent conductive layer, a source, and a drain can be achieved by wet etching to effectively improve the non-homogeneous etching for the channel region in conventional five-mask processes. In the present embodiment, the second photolithography step is accompanied with dry etching.

Furthermore, the transmittance of the mask in the second photolithography step of the present embodiment is about 45%. The thickness of the semiconductor channel regions 121 in the TFTs formed after etching is about 1100 Å. In the present embodiment, the thickness of the first insulation layer 23 after etching can be determined by adjusting the half-tone mask so that the capacitance of the auxiliary capacitance areas 14 can be controlled.

In the present embodiment, the first metal layer 22 is used as the gate for every transistor switch area 12. Besides, the insulation layer 23 is made of $SiN_x$; the semiconductor layer 24 is made of amorphous silicon (α-Si); and the ohmic contact layer 24 is made of $N^+$ amorphous silicon. The ohmic contact layer 25 can achieve good ohmic contact between the semiconductor layer 24 and an upper TFT component layer so as to promote the electrical conductivity and the efficiency of the TFTs in the present invention.

As shown in FIG. 2(c), a transparent conductive layer 26 (such as indium zinc oxide, indium tin oxide, and indium tin zinc oxide) and a second metal layer 27 (such as aluminum metal material) are deposited in sequence on the surfaces of the data-line areas 11, every transistor switch area 12, and the first insulation layer 22. Subsequently, a third photolithography step is performed to form data lines 11 and to define pixel areas 13 of the substrate 21. Finally, the TFTs are completed.

In the third photolithography step of the present embodiment, a photoresist 29 is coated on the surface of the second metal layer 27. Furthermore, exposure and development are performed with a half-tone mask to make the photoresist 29 have different thicknesses. Subsequently, the second metal layer 27, the transparent conductive layer 26, the ohmic contact layer 25, and part of the semiconductor layer 24, which are uncovered by the photoresist 29, are removed by wet etching. The etching continues until the semiconductor layer 24 uncovered by the photoresist 29 is removed. Therefore, a channel region 121 is formed in every transistor switch area 12.

$O_2$ ashing is performed on the photoresist 29 to remove the photoresist 29 on the surface of the pixel areas 13. Subsequently, the second metal layer 27 on the surfaces of the pixel areas 13 is processed by wet etching in order to reveal the transparent conductive layer 26 in the pixel areas 13 of the substrate. A substrate structure shown in FIG. 2(d) is obtained.

In the present embodiment, the source and the drain in every transistor switch area 12 respectively contain the second metal layer 27. Besides, the source and the drain are not conducted to each other.

Consequently, as shown in FIG. 2(e), a second insulation layer 28 is deposited on the surfaces of the first insulation 23 and the transistor switch areas 12, to protect the completed TFTs. The second insulation 28 and the first insulation 23 are patterned by a fourth photolithography step so as to reveal part of the first metal layer 22. The revealed part of the first metal layer 22 is used for a terminal region 15 on the surface of the substrate in the present embodiment. A sectional view of an LCD substrate completed in the present embodiment is shown in FIG. 2(e).

Embodiment 2

The method for manufacturing a TFT-LCD substrate is performed with four-mask photolithography. Except for uses of half-tone masks, others processes in the present embodiment are similar to those in Embodiment 1.

FIGS. 3(a) to 3(e) show a flow chart for manufacturing an LCD substrate of the present embodiment, and sectional views of those figures are taken along the I-I' line shown in FIG. 1A.

Figure 3:
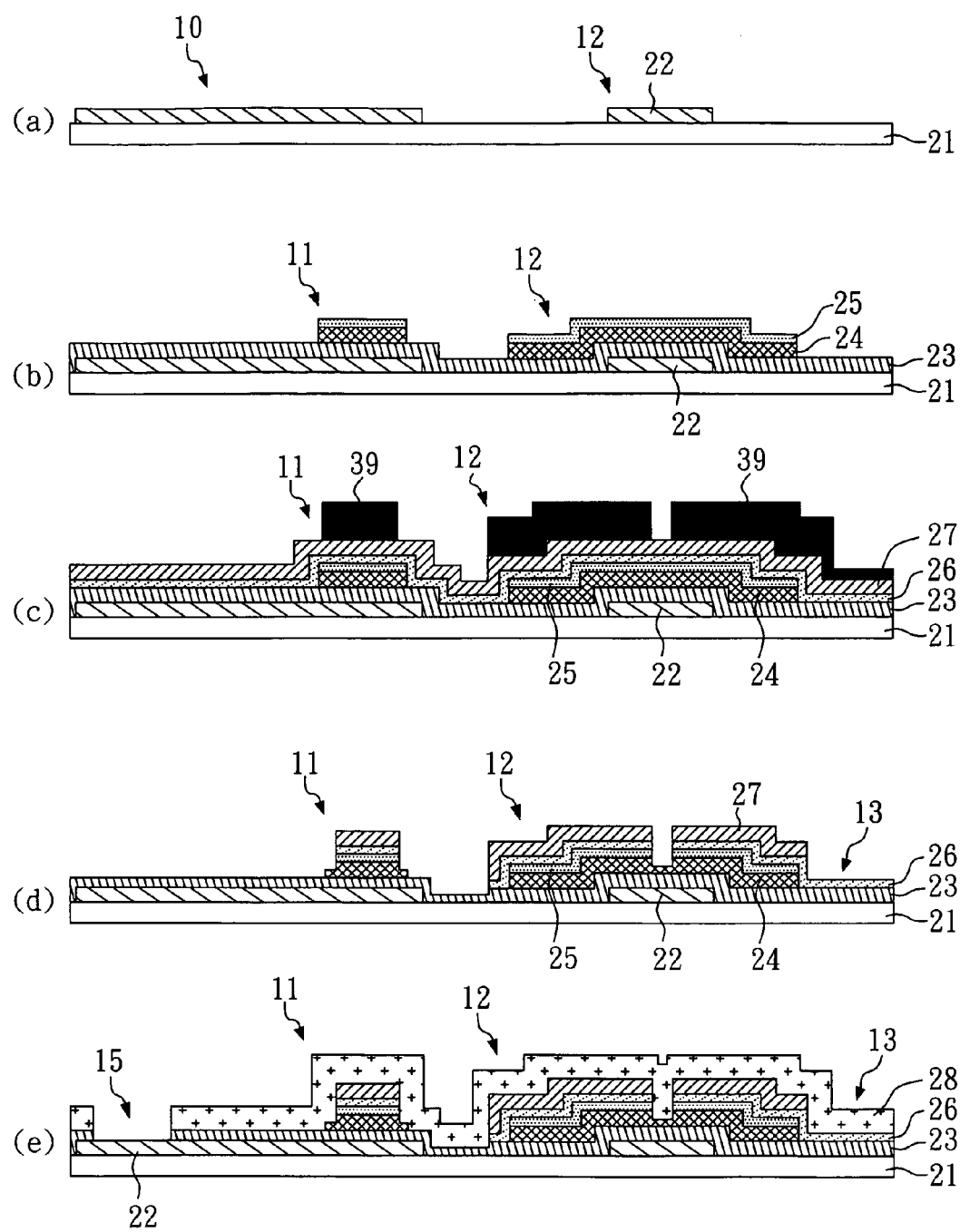
FIGS. 3(a) to 3(e) show a flow chart for manufacturing an LCD substrate in one preferred embodiment of the present invention, in which sectional views of the present figure are taken along the I-I' line shown in FIG. 1A.

Similar to the step in Embodiment 1, as shown in FIG. 3(a), a first metal layer 22 is formed on the surface of a transparent glass substrate 21, and is processed by a first photolithography step to form a gate layer pattern.

Subsequently, in FIG. 3(b), data-line areas 11, transistor switch areas 12, and auxiliary capacitance areas 14 (not shown in FIG. 3(b)) are defined on the surface of the substrate 21 by a second photolithography step. The second photolithography step is performed with a general mask, and thus data-line areas are not defined with a channel region of every transistor switch area 12 or with that of the semiconductor layer.

In a third photolithography step of the present embodiment, as shown in FIG. 3(c), a photoresist layer 39 is coated on the surface of the second metal layer 27. Furthermore, exposure and development with a half-tone mask are performed to make the photoresist layer 39 have different thicknesses. Subsequently, the second metal layer 27, the transparent conductive layer 26, the ohmic contact layer 25, and part of the semiconductor layer 24, which are uncovered by the photoresist layer 39, are removed by wet etching. The etching continues until the semiconductor layer 24 uncovered by the photoresist 29 is removed. Therefore, a channel region is formed in every transistor switch area 12.

Moreover, $O_2$ ashing is performed on the photoresist layer 39 to remove the residual photoresist layer 39. Subsequently, the second metal layer 27 on the surfaces of the pixel areas 13 is processed by wet etching in order to reveal the transparent conductive layer 26 in the pixel areas 13 of the substrate 21. A substrate structure shown in FIG. 3(d) is obtained.

A fourth photolithography step performed in the present embodiment is similar as illustrated in Embodiment 1. The second insulation layer 28 and the first insulation layer 23 are patterned by the fourth photolithography step to reveal part of the first metal layer 22. The revealed part of the first metal layer 22 is used for a terminal region 15 on the surface of the substrate in the present embodiment. A sectional view of an LCD substrate completed in the present embodiment is shown in FIG. 3(e).

Embodiment 3

The method for manufacturing a TFT-LCD substrate is performed with four-mask photolithography. Except for uses of half-tone masks, others processes in the present embodiment are similar to those in Embodiment 1.

FIGS. 4(a) to 4(e) show a flow chart for manufacturing an LCD substrate of the present embodiment. The method for manufacturing the LCD substrate in the present embodiment is similar to that in Embodiment 1, except for the photoresist 49 formed with a different pattern in the present embodiment. Other aspects in the present embodiment are the same as those in Embodiment 1.

Figure 4:
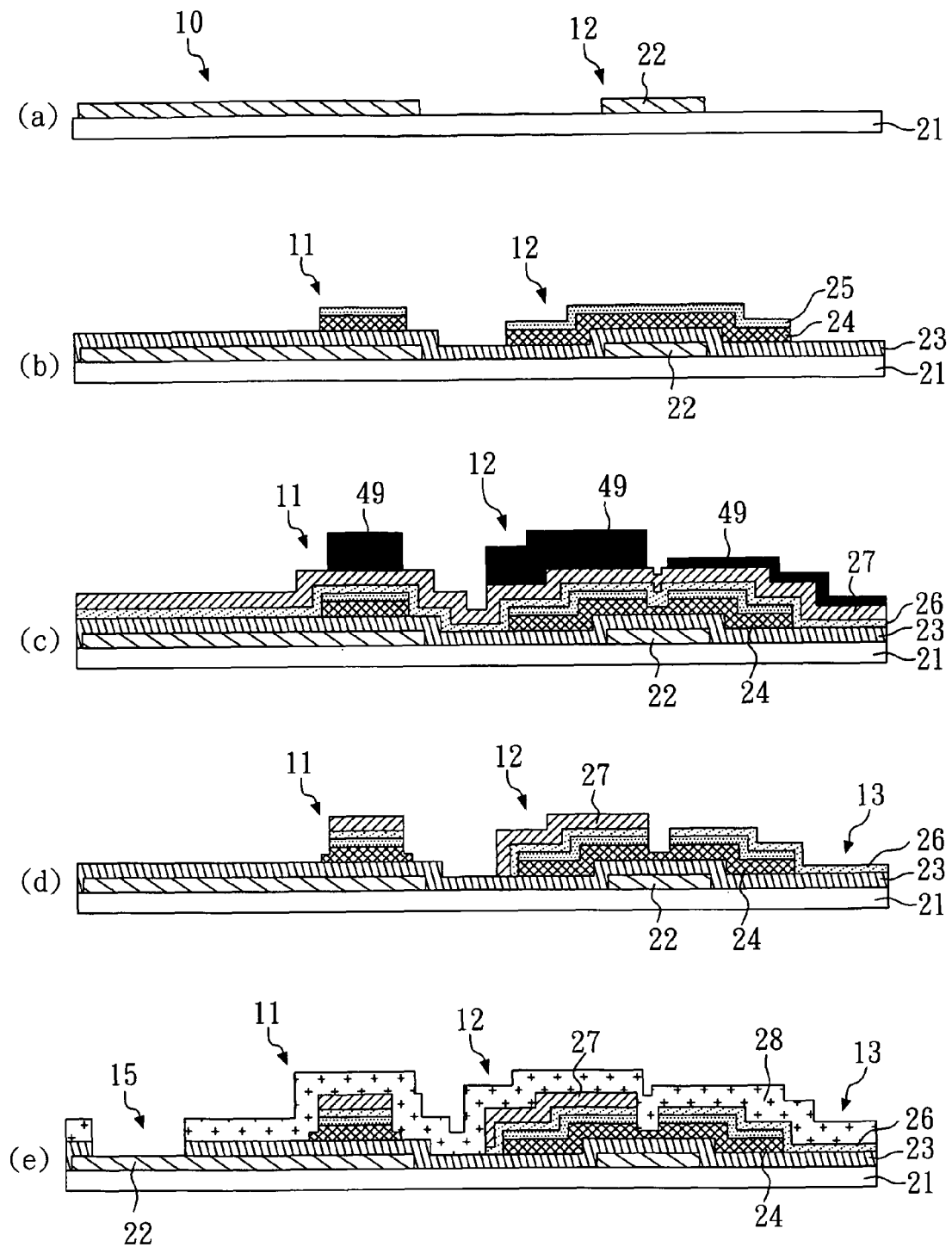
FIGS. 4(a) to 4(e) show a flow chart for manufacturing an LCD substrate in one preferred embodiment of the present invention, in which sectional views of the present figure are taken along the I-I' line shown in FIG. 1A.

With reference to FIG. 4(c), in a third photolithography step of the present embodiment, as shown in FIG. 3(c), a photoresist 49 is coated on the surface of the second metal layer 27. Furthermore, exposure and development with a half-tone mask are performed to make the photoresist 49 have different thicknesses. Subsequently, the second metal layer 27, the transparent conductive layer 26, the ohmic contact layer 25, and part of the semiconductor layer 24, which are uncovered by the photoresist layer 39, are removed by wet etching according to Embodiment 1. The etching continues until the semiconductor layer 24 uncovered by the photoresist 29 is removed. Therefore, a channel region is formed in every transistor switch area 12.

Moreover, the residual photoresist 49 is removed by $O_2$ ashing. At the same time, the second metal layer 27 on the surfaces of the pixel areas 13 is also removed in order to reveal the transparent conductive layer 26. A substrate structure shown in FIG. 4(d) is obtained. The revealed transparent conductive layer 26 can be used as the drain in the TFTs completed in the present embodiment.

A fourth photolithography step performed in the present embodiment is the same as illustrated in Embodiment 1. The insulation layers are patterned by the fourth photolithography step to reveal part of the first metal layer 22. The revealed part of the first metal layer 22 is used as a terminal region 15 on the surface of the substrate. A sectional view of an LCD substrate completed in the present embodiment is shown in FIG. 4(e).

In conclusion, in the method for manufacturing the LCD substrate of the present invention, the gate and the pattern of the metal conductive lines are defined by the first mask, and then, the pattern of the transistor switch areas is defined by the second mask. Subsequently, the transparent electrode and the second metal are deposited, and are defined to form a drain, a source, metal conductive lines, and pixel areas by the third mask (as the half-tone masks illustrated in the above-mentioned embodiments). Finally, the protection layer is deposited, and is exposed to form a terminal region on the surface of the substrate by the fourth mask.

Therefore, four-mask processes of the present invention for manufacturing the LCD substrate can be used to reduce the time involved therein, and to improve the yield of the production. Besides, problems of alignment deviation and parasitic capacitance produced from conventional five-mask processes for manufacturing the substrate can be avoided.

Although the present invention has been explained in relation to its preferred embodiment, it is to be understood that many other possible modifications and variations can be made without departing from the scope of the invention as hereinafter claimed.

What is claimed is:

1. A method for manufacturing an array substrate in a four mask process, comprising steps in the following sequence:
   (a) providing a substrate;
   (b) forming a patterned first metal layer on the surface of the substrate, by a first mask process;
   (c) forming a first insulation layer and a semiconductor layer in sequence to cover the substrate and the first metal layer, and patterning the semiconductor layer by photolithography to form plural transistor switch areas and etching the semiconductor layer in every transistor switch area by photolithography to form a channel region, by a second mask process;
   (d) forming a transparent conductive layer and a second metal layer in sequence over the substrate and in the channel region to cover the first insulating layer and the semiconductor layer;
   (e) forming a photoresist on the surface of the second metal layer, and performing exposure and development to make the photoresist have at least two thicknesses;
   (f) wet etching the second metal layer uncovered by the photoresist, the transparent conductive layer uncovered by the photoresist, and the photoresist to form a source and a drain in every transistor switch area, and etching the semiconductor layer in every transistor switch area to reveal the channel region, by a third mask process, and
   (g) forming a patterned second insulation layer on the surfaces of the transistor switch areas and the first insulation layer, by a fourth mask process on the array substrate;
   wherein the transistor switch areas comprise the second metal layer, and the source and the drain are not conducted to each other.

2. The method as claimed in claim 1, wherein step (f) comprises revealing part of the transparent conductive layer.

3. The method as claimed in claim 2, wherein the revealed part of the transparent conductive layer is placed out of the transistor switch areas, or out of the second metal layer of the transistor switch areas.

4. The method as claimed in claim 2, wherein the revealed part of the transparent conductive layer is a pixel area of the substrate.

5. The method as claimed in claim 1, wherein a half-tone mask is used to perform exposure and development in the photolithography.

6. The method as claimed in claim 1, wherein the source and the drain in every transistor switch area respectively comprise the second metal layer, and do not connect to each other.

7. The method as claimed in claim 1, wherein the drain in every transistor switch area does not comprise the second metal layer.

8. The method as claimed in claim 1, wherein the transistor switch areas formed in step (c) comprises the first metal layer.

9. The method as claimed in claim 1, wherein step (c) comprises: forming plural capacitance areas and plural conductive-line areas while forming the transistor switch areas, in which the capacitance areas, the conductive-line areas, and the transistor switch areas do not overlap each other respectively.

10. The method as claimed in claim 9, wherein the conductive-line areas are plural data-line areas.

11. The method as claimed in claim 1, wherein the patterned first metal layer formed in step (b) comprises a gate used in every transistor switch area and plural scan lines.

12. The method as claimed in claim 1 wherein step (g) comprises: forming a second insulation layer on the surfaces of the first insulation layer and the transistor switch areas; and patterning the second insulation layer and the first insulation layer by the photolithography to reveal part of the first metal layer.

13. The method as claimed in claim 12, wherein the revealed part of the first metal layer is a terminal region of the substrate.

14. The method as claimed in claim 1, wherein an ohmic contact layer is formed on the surface of the semiconductor layer after step (c) of forming the semiconductor layer.

* * * * *

UNITED STATES PATENT AND TRADEMARK OFFICE
CERTIFICATE OF CORRECTION

PATENT NO. : 8,551,822 B2  
APPLICATION NO. : 12/005289  
DATED : October 8, 2013  
INVENTOR(S) : Chun-Hao Tung et al.

It is certified that error appears in the above-identified patent and that said Letters Patent is hereby corrected as shown below:

On the title page item 75

"Inventor: Chun-Hao Tung, Hsin-Chu (TW)"

should read:

--Inventors: Chun-Hao Tung, Hsin-Chu (TW)  
           Tzu-Mei Wu, Hsin-Chu (TW)--

Signed and Sealed this  
Eighth Day of March, 2016

Michelle K. Lee  
*Director of the United States Patent and Trademark Office*